United States Patent
Yoshida

(10) Patent No.: US 9,673,274 B2
(45) Date of Patent: Jun. 6, 2017

(54) SHALLOW TRENCH ISOLATION TRENCHES AND METHODS FOR NAND MEMORY

(71) Applicant: SanDisk Technologies Inc., Plano, TX (US)

(72) Inventor: Yusuke Yoshida, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/670,362

(22) Filed: Mar. 26, 2015

(65) Prior Publication Data

US 2016/0284798 A1   Sep. 29, 2016

(51) Int. Cl.
*H01L 21/70* (2006.01)
*H01L 29/06* (2006.01)
*H01L 21/762* (2006.01)
*H01L 27/11524* (2017.01)
*H01L 27/11529* (2017.01)

(52) U.S. Cl.
CPC .... *H01L 29/0649* (2013.01); *H01L 21/76224* (2013.01); *H01L 27/11524* (2013.01); *H01L 27/11529* (2013.01)

(58) Field of Classification Search
CPC ........... H01L 29/0649; H01L 21/76205; H01L 21/76224; H01L 27/11524
USPC ......................................................... 257/510
See application file for complete search history.

(56) References Cited

U.S. PATENT DOCUMENTS

| | | | |
|---|---|---|---|
| 9,076,868 B1 * | 7/2015 | Tsai | H01L 21/76232 |
| 2007/0018215 A1 * | 1/2007 | Sandhu | H01L 21/76232 257/296 |
| 2007/0029635 A1 * | 2/2007 | Smith | H01L 29/7833 257/510 |
| 2011/0248333 A1 * | 10/2011 | Meotto | H01L 27/105 257/324 |

* cited by examiner

*Primary Examiner* — Matthew Gordon
(74) *Attorney, Agent, or Firm* — Vierra Magen Marcus LLP

(57) ABSTRACT

A NAND memory is provided that includes a memory cell region and a peripheral region. The peripheral region includes a shallow trench isolation trench disposed in a substrate. The shallow trench isolation trench has a first tab extension and a second tab extension. The first tab extension is disposed at a top portion of the shallow trench isolation trench, and extends in a first direction from the shallow trench isolation trench. The second tab extension is disposed at a top portion of the shallow trench isolation trench, and extends in a second direction from the shallow trench isolation trench.

13 Claims, 23 Drawing Sheets

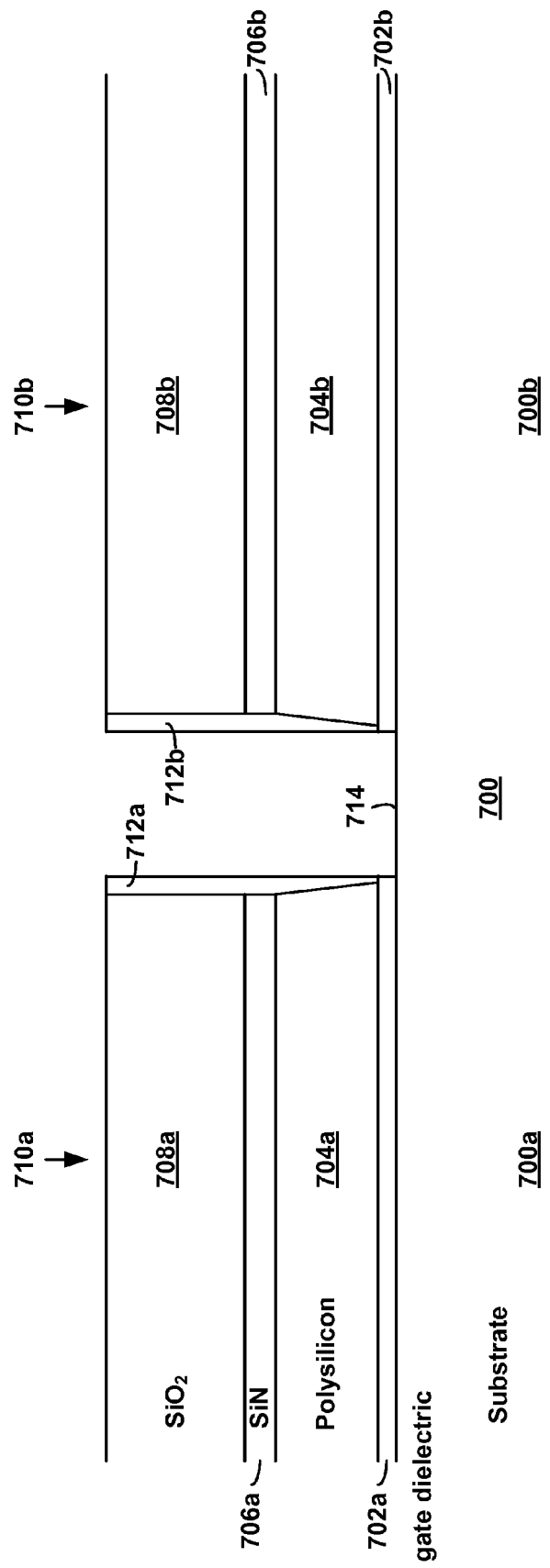

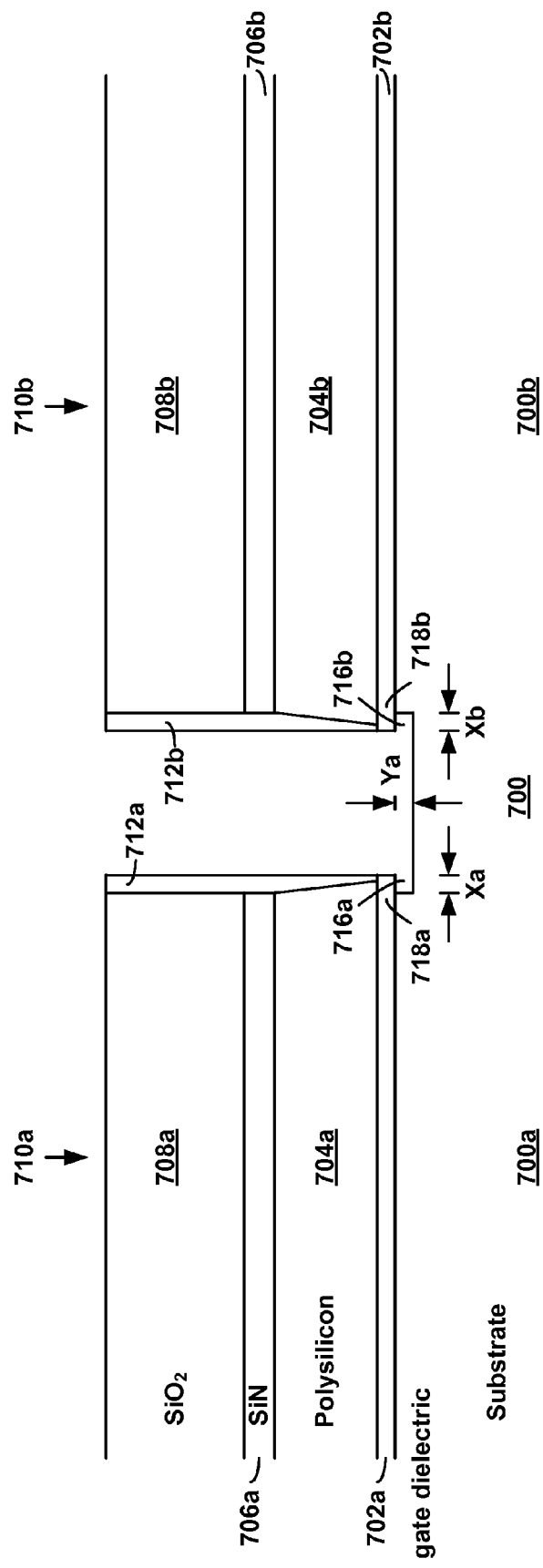

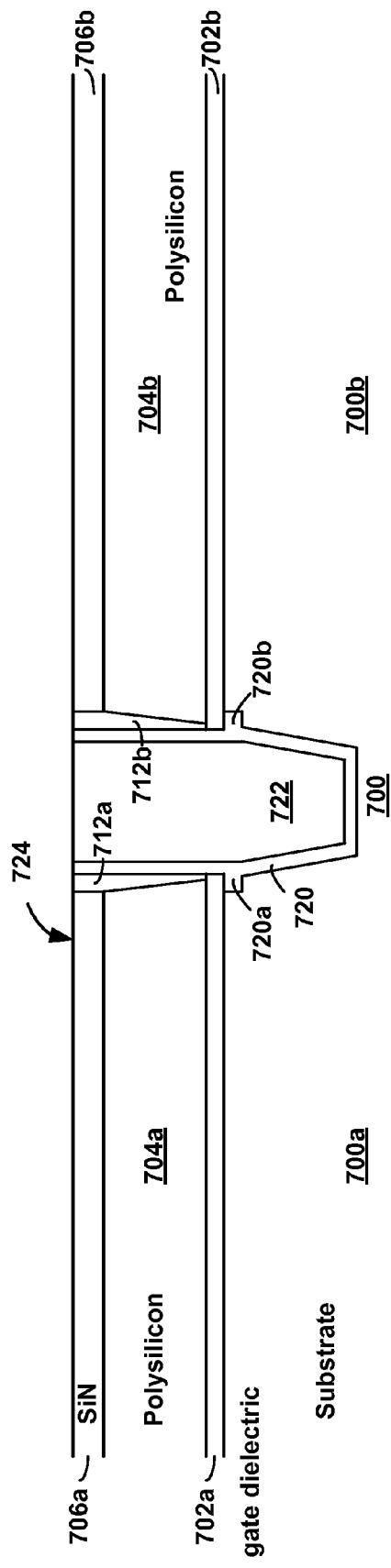

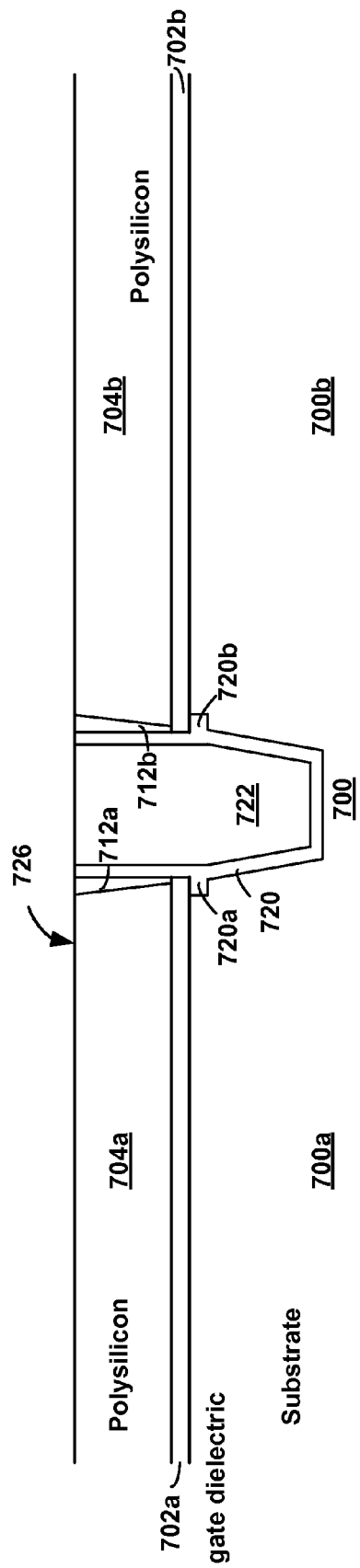

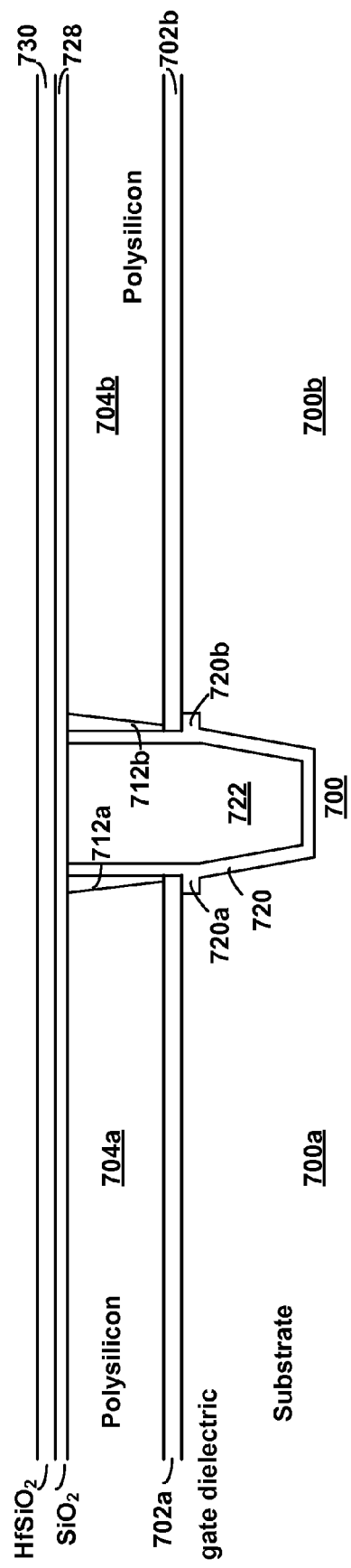

SHALLOW TRENCH ISOLATION TRENCHES AND METHODS FOR NAND MEMORY

BACKGROUND

Embodiments of the present disclosure are directed to high density semiconductor devices, such as non-volatile memory, and methods of forming the same.

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof.

The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate.

For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material, or a double floating gate stack that includes a polysilicon material (doped or undoped) and a metal layer, with a dielectric material separating the metal and polysilicon material layers. Other types of memory cells in flash EEPROM systems can utilize a non-conductive dielectric material in place of a conductive floating gate to form a charge storage element capable of storing charge in a non-volatile manner.

As demands for higher densities in integrated circuit applications have increased, fabrication processes have evolved to reduce the minimum feature sizes of circuit elements such as the gate and channel regions of transistors.

Existing fabrication techniques, however, may not be sufficient to fabricate integrated devices these devices.

DETAILED DESCRIPTION

A NAND memory is provided that includes a memory cell region and a peripheral region. The peripheral region includes a shallow trench isolation trench in a semiconductor substrate. The shallow trench isolation trench has a first tab extension and a second tab extension. The first tab extension is disposed at a top portion of the shallow trench isolation trench, and extends in a first direction from the shallow trench isolation trench. The second tab extension is disposed at a top portion of the shallow trench isolation trench, and extends in a second direction from the shallow trench isolation trench.

Without wanting to be bound by any particular theory, it is believed that the first tab extension and the second tab extension may prevent gouging of an active area portion of a peripheral transistor region of the substrate. In addition, without wanting to be bound by any particular theory, it is believed that the first tab extension and the second tab extension may prevent polysilicon residue forming as a result of under-etching of a capacitor bottom plate material.

Figure 1:
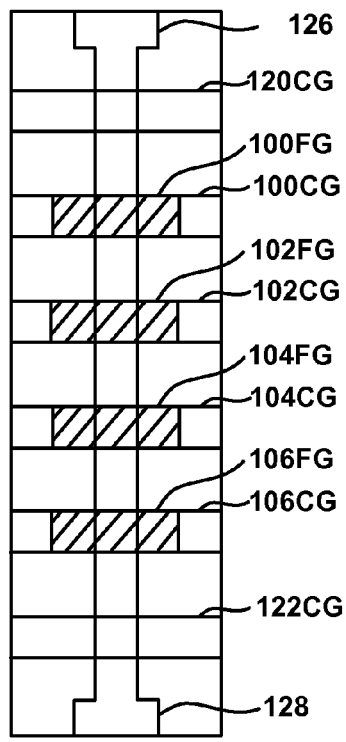
FIG. 1 is a top view of a NAND string.
Figure 2:
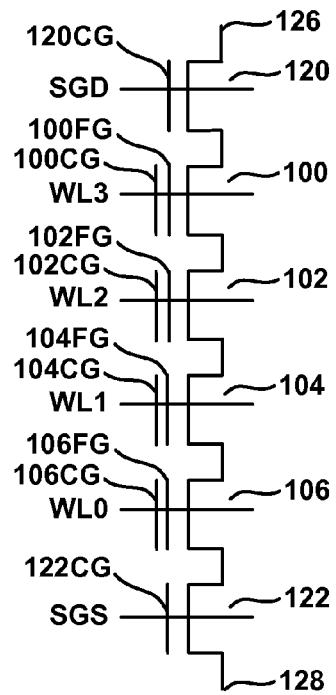
FIG. 2 is an equivalent circuit diagram of the NAND string depicted in FIG. 1.
Figure 3:
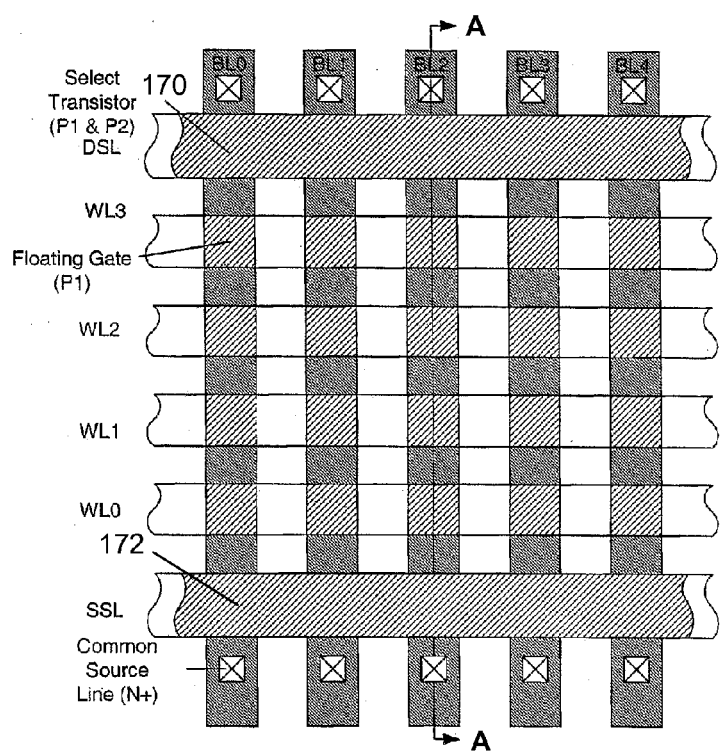
FIG. 3 is a plan view of a portion of a NAND flash memory array.

An example of a type of memory system that can be fabricated in accordance with one embodiment is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon or other conductive material, such as tungsten/tungsten nitride or other conductive material.

Figure 4:
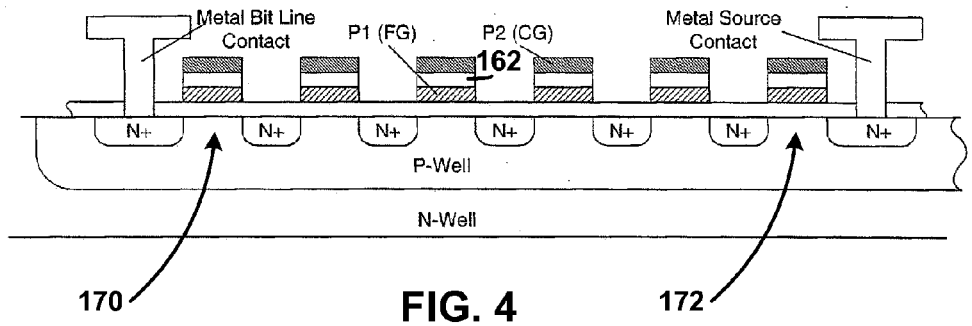
FIG. 4 is an orthogonal cross-sectional view taken along line A-A of the portion of the flash memory array depicted in FIG. 3.

FIG. 4 is a cross-sectional view taken along line A-A of FIG. 3, depicting layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL.

In some embodiments, the floating gate material (P1) optionally can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel.

Figure 5:
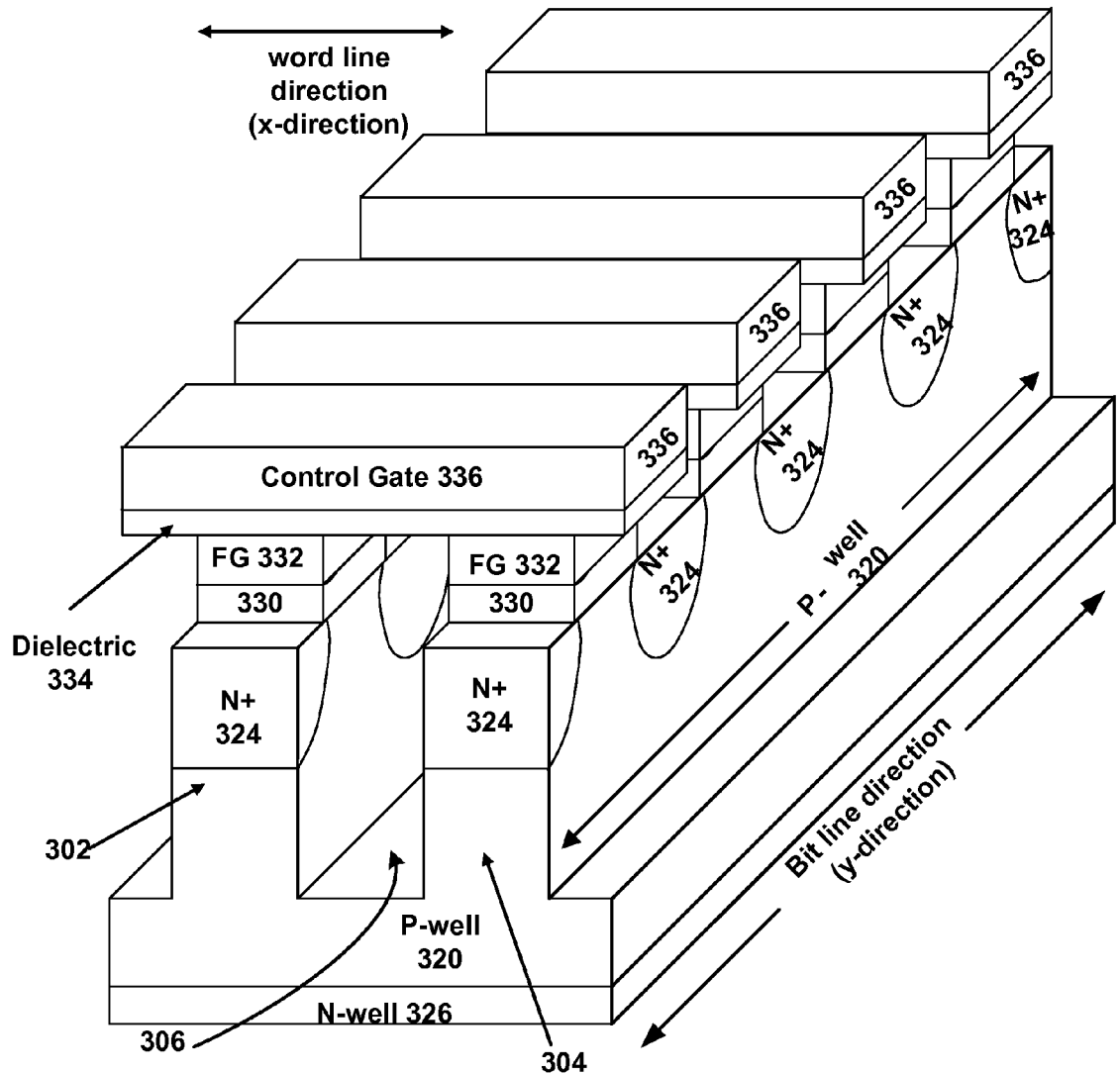
FIG. 5 is a three-dimensional drawing of a pair of four word line long portions of two NAND strings.

FIG. 5 is a three-dimensional block diagram of two exemplary NAND strings 302 and 304 that may be fabricated as part of a larger flash memory array. FIG. 5 depicts four memory cells on strings 302 and 304 as an example. FIG. 5 depicts N-well 326 below P-well 320. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 326 is not shown in FIG. 5.

In an embodiment, the control gates form the word lines. A continuous layer of conductive layer 336 can be formed which is consistent across a row in order to provide a common word line or control gate for each device on that word line. In such a case, this layer can be considered to form a control gate for each memory cell at the point where the layer overlaps a corresponding floating gate layer 332. Floating gate layer 332 and conductive layer 336 are separated by a dielectric layer 334. In some embodiments, dielectric layer 334 may be a single layer of dielectric material, or may be a multi-layer stack of dielectric materials. In other embodiments, individual control gates can be formed and then interconnected by a separately formed word line.

When fabricating a NAND-type non-volatile memory system, including NAND strings as depicted in FIG. 5, electrical isolation is provided in the word line direction between adjacent strings. In the embodiment depicted in FIG. 5, NAND string 302 is separated from NAND string 304 by isolation area 306.

A flash memory device formed on a silicon substrate may include a memory cell region and a peripheral region. Memory cell transistors of a memory cell array, such as NAND strings 302 and 304 are arranged at the memory cell region, and functional circuits other than the memory cell transistors are arranged at the peripheral region.

Unlike the memory cell region including the memory cell transistors, high voltage and low voltage transistors and/or capacitors may be formed at the peripheral region of a flash memory device. The low voltage transistors may be used to form functional circuits such as a page buffer, a data input/output buffer, and the like.

Figure 6A:
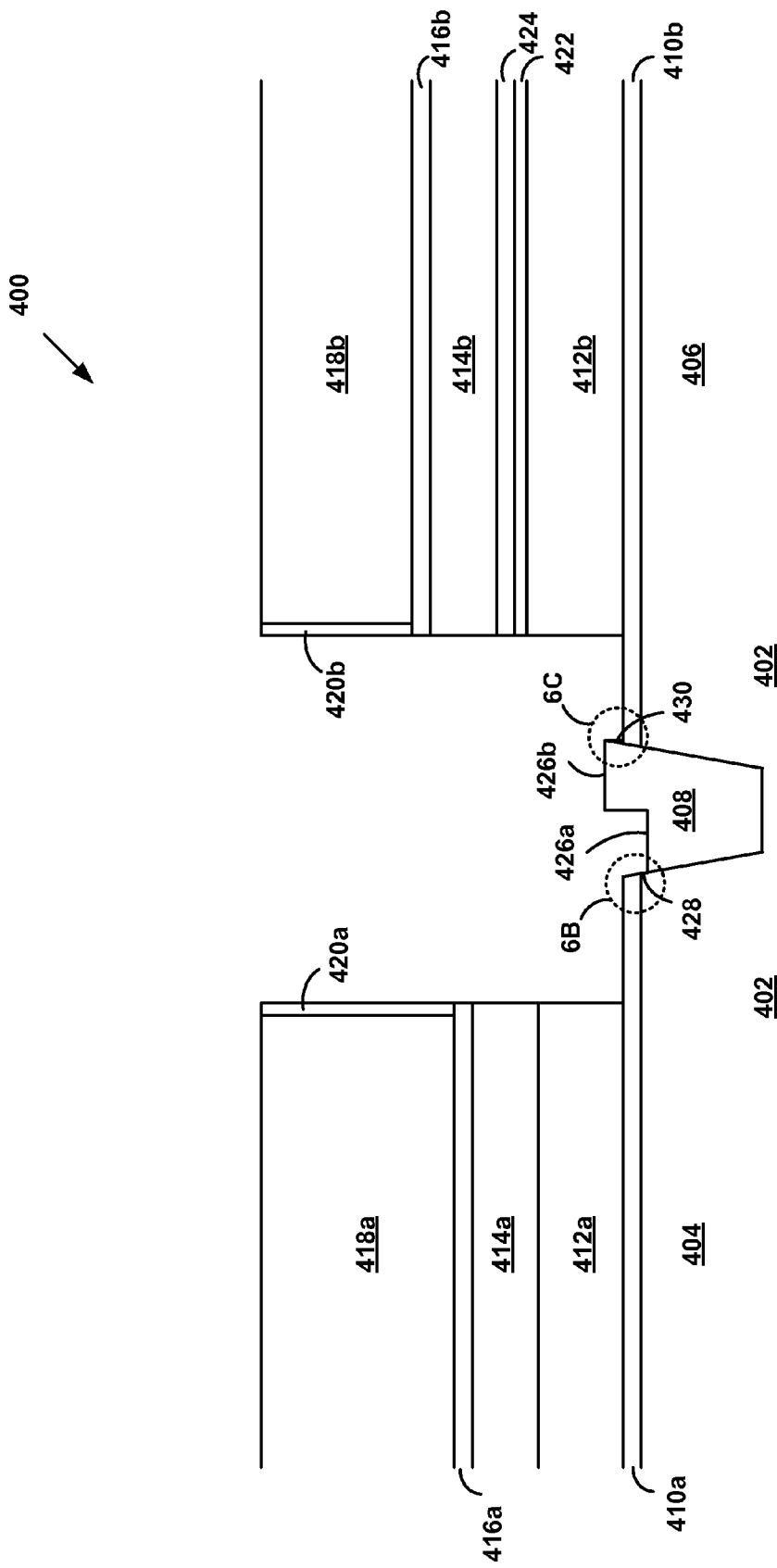
FIG. 6A is a cross-sectional view of a portion of a peripheral region of a flash memory device.

FIG. 6A illustrates a cross-sectional view during formation of a peripheral region 400 of a flash memory device. In particular, peripheral region 400 includes a substrate 402 which includes a transistor region 404 and a capacitor region 406, separated by a dielectric trench 408 (e.g., $SiO_2$ shallow trench isolation (STI) trenches) formed in substrate 402. At the stage of processing shown in FIG. 6A, transistor region 404 includes a thin oxide layer 410a, such as $SiO_2$, on substrate 402, a doped polysilicon region 412a on thin oxide region 410a, a tungsten/tungsten nitride region 414a on doped polysilicon region 412a, a dielectric barrier region 416a, such as silicon nitride, on tungsten/tungsten nitride region 414a, and dielectric regions 418a and 420a (e.g., both $SiO_2$) on dielectric barrier region 416a. Tungsten/tungsten nitride region 414a and doped polysilicon region 412a are electrically coupled, and act as a gate electrode of transistors formed in transistor region 404, with thin oxide region 410a forming a gate oxide of such transistors.

In addition, capacitor region 406 includes a thin oxide region 410b, such as $SiO_2$, on substrate 402, a doped polysilicon region 412b on thin oxide region 410a, a first dielectric region 422, such as $SiO_2$ on doped polysilicon region 412b, a second dielectric region 424, such as $HfSiO_2$ on first dielectric region 422, a tungsten/tungsten nitride region 414b on second dielectric region 424, a dielectric barrier region 416b, such as silicon nitride, on tungsten/tungsten nitride region 414b, and dielectric regions 418b and 420b (e.g., both $SiO_2$) on dielectric barrier region 416b. In some embodiments, tungsten/tungsten nitride region 414b and doped polysilicon region 412b are used to form top and bottom electrodes, respectively, of capacitors formed in capacitor region 406, with first dielectric region 422 and second dielectric region 424 forming the dielectric material sandwiched between the top and bottom electrodes. In other embodiments, doped polysilicon region 412b and substrate 402 are used to form top and bottom electrodes, respectively, of capacitors formed in capacitor region 406, with thin oxide region 410b forming the dielectric material sandwiched between the top and bottom electrodes.

During the processing steps used to form the structure shown in FIG. 6A, portions of the material layers used to form first dielectric region 422 and second dielectric region 424 are etched away from transistor region 404 to avoid impurity contamination of transistors from precursors, such as carbon or nitrogen for example. As a result of that etching process, a top portion 426a of STI trench 408 in transistor region 404 typically is lower than a top portion 426b of STI trench 408 in capacitor region 406. Following the etch process, the tungsten/tungsten nitride, silicon nitride and silicon oxide material layers are deposited over substrate 402, and a reactive ion etch (RIE) process typically is then used to remove various material layers to form the structure of FIG. 6A.

Figure 6C:
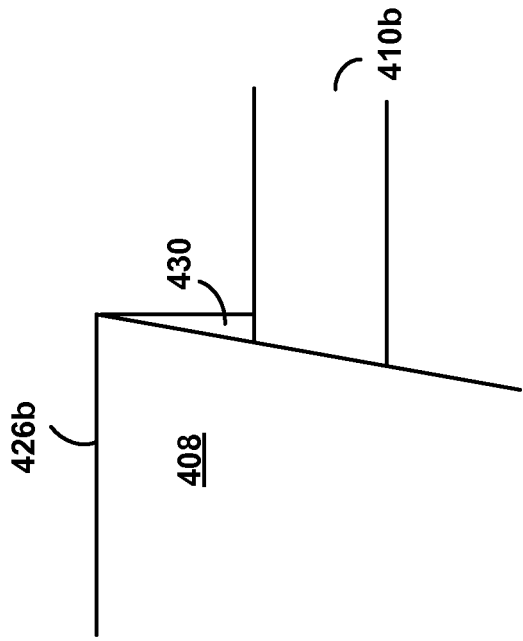
FIGS. 6B and 6C are expanded views of portions of the cross-sectional view of FIG. 6A.
Figure 6B:
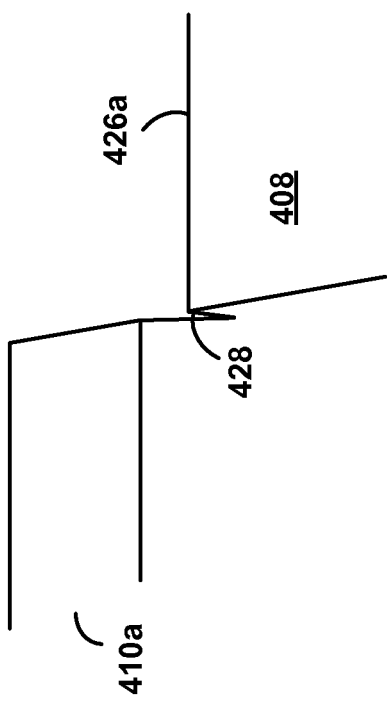

During the RIE process, over-etching of the material layers used to form first dielectric layer 422, second dielectric layer 424 and STI trench 408 may cause exposure of transistor region 404, and subsequent etching of doped polysilicon regions 412a and 412b may cause gouging of an active area portion 428 of the exposed transistor region 404, shown in more detail in FIG. 6B. As a result of such over-etching, silicon substrate leakage may occur. In addition, referring again to FIG. 6A, during a subsequent etch of the doped polysilicon layer used to form doped polysilicon regions 412a and 412b, under-etching of first dielectric layer 422, second dielectric layer 424 and STI trench 408 may result in top portion 426b of STI trench 408 covering polysilicon residue portion 430, shown in more detail in FIG. 6C, and protecting polysilicon portion 430 during the polysilicon etch. Thus, because of the very small window for the etching process for layers 408, 422 and 424, there is a tradeoff between over-etching, which may cause gouging of active area portion 428, and under-etching, which may result in polysilicon residue portion 430. Fabrication processes are described to reduce or eliminate such over-etching and under-etching.

Figure 7A:
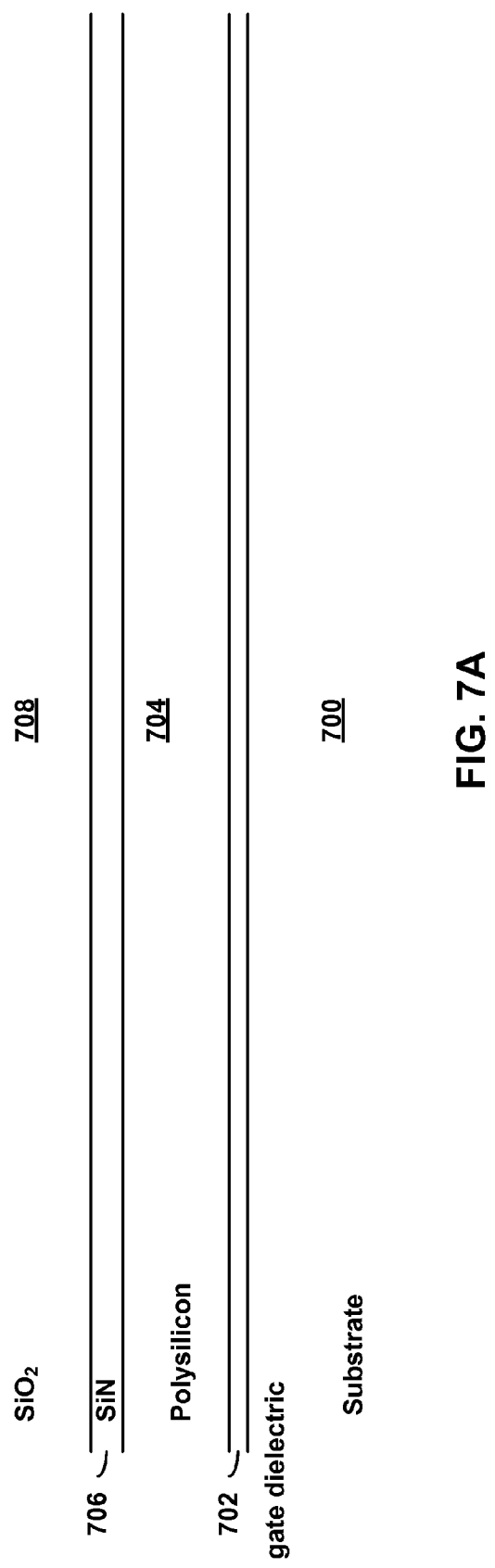
FIGS. 7A-7R are cross-sectional views of a portion of a substrate during an example fabrication of a peripheral region of a flash memory device.
Figure 7B:
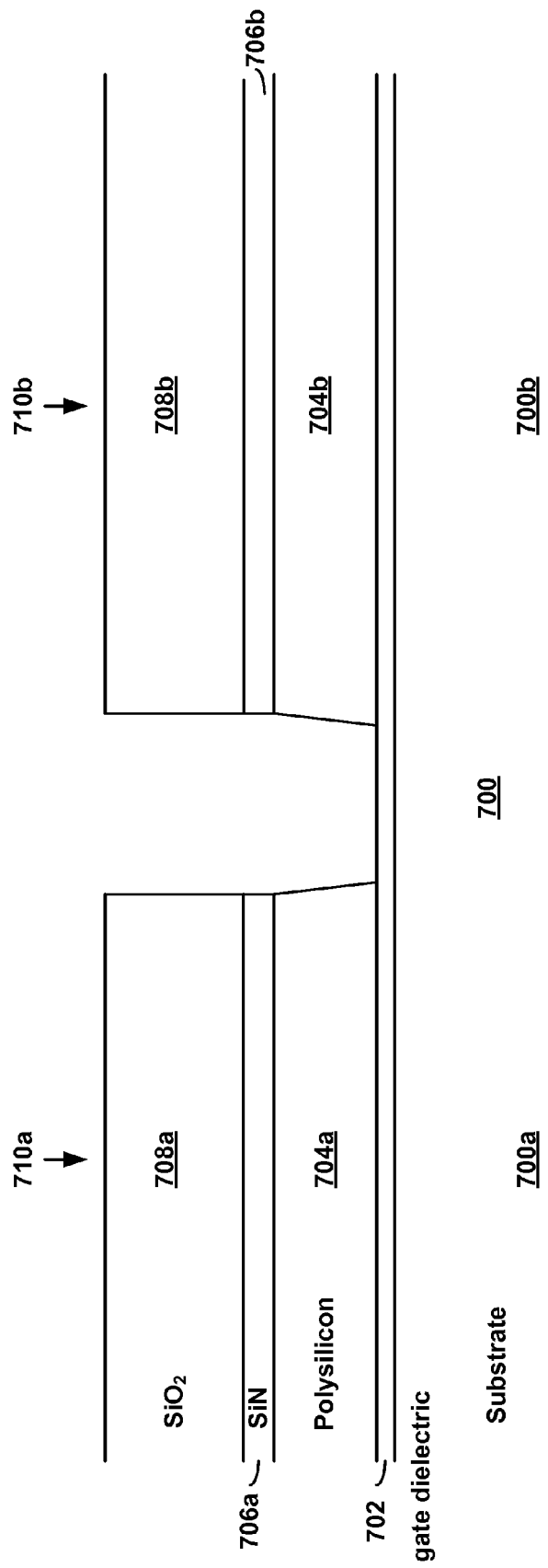
Figure 7C:
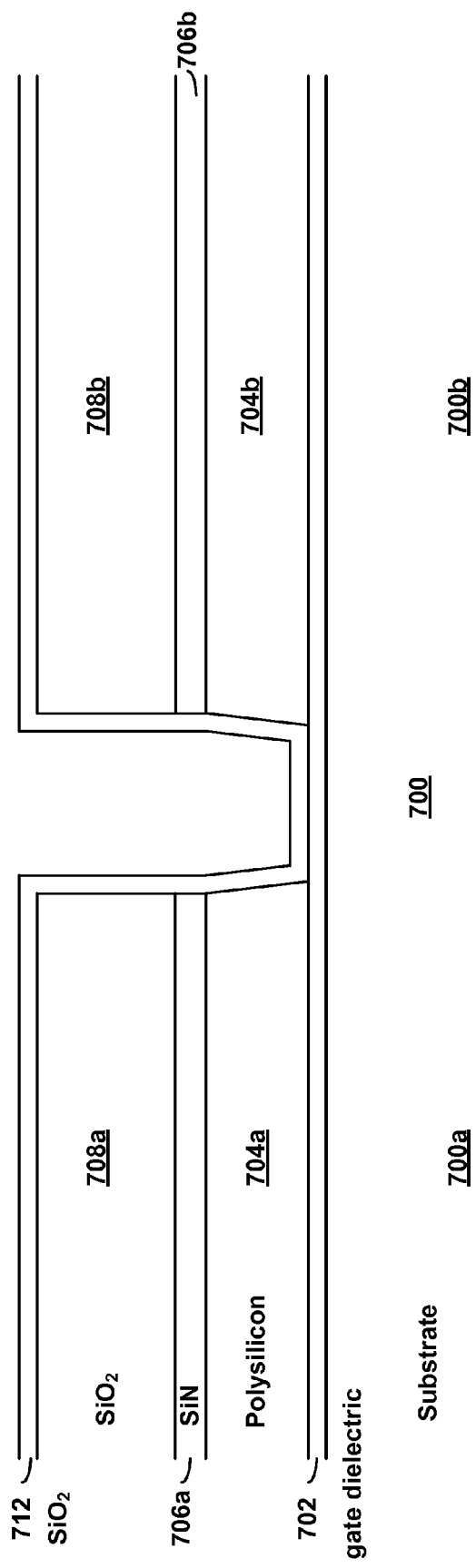
Figure 7F:
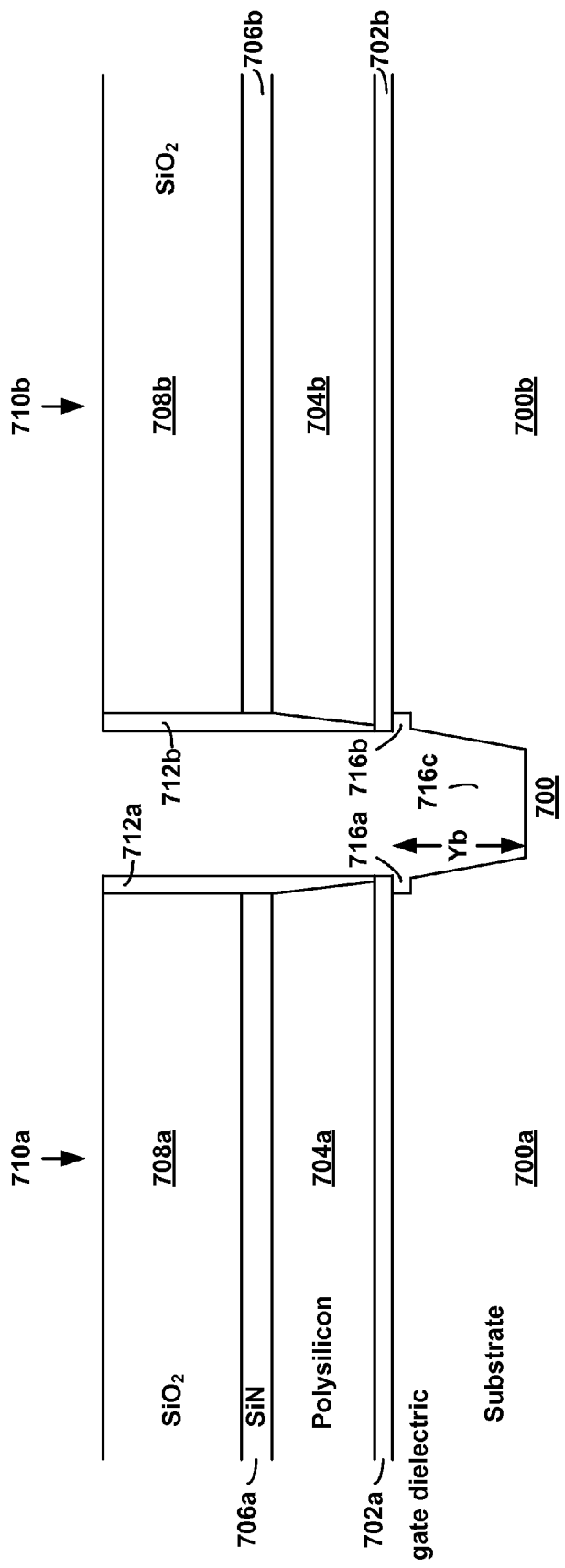
Figure 7G:
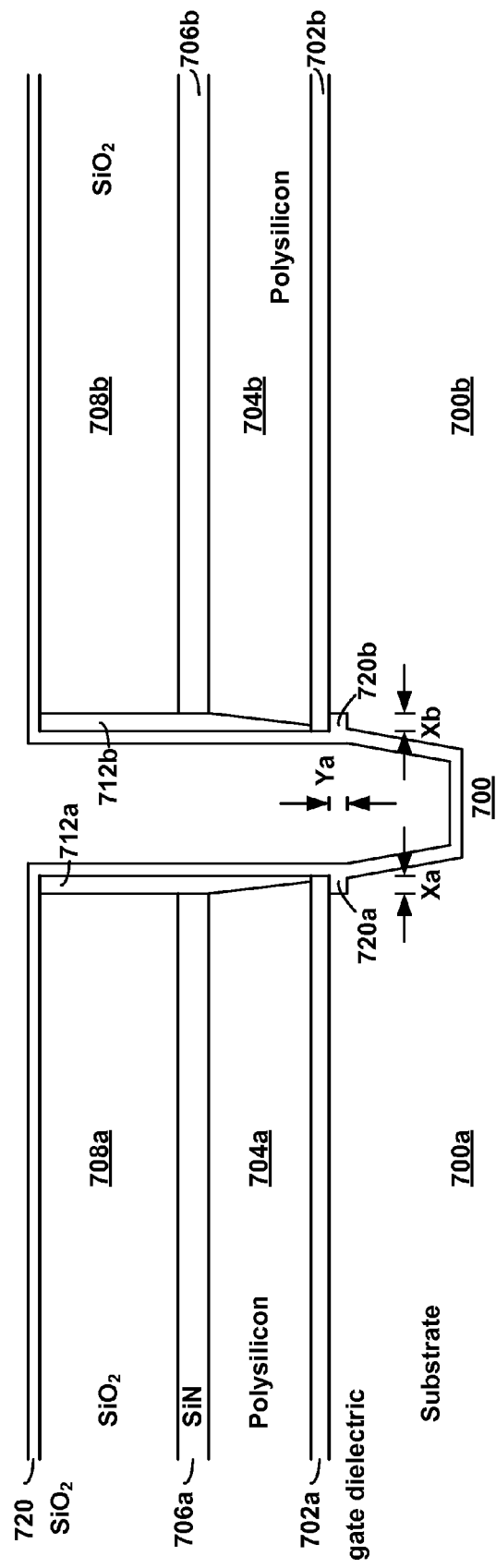
Figure 7H:
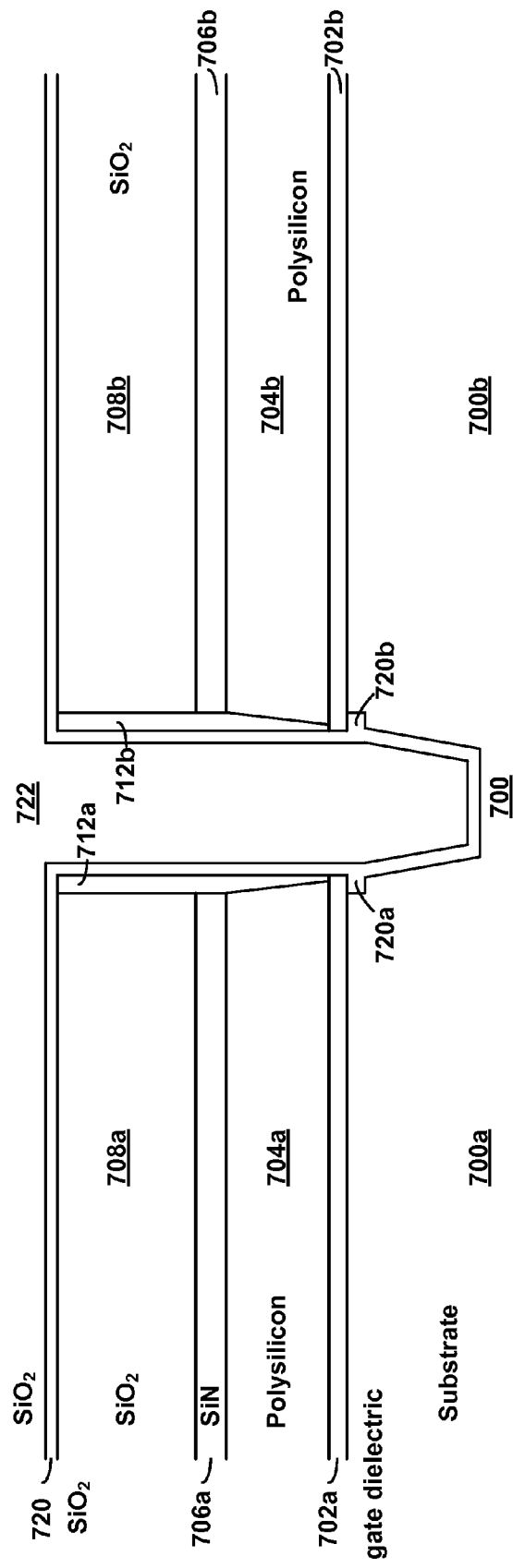
Figure 7L:
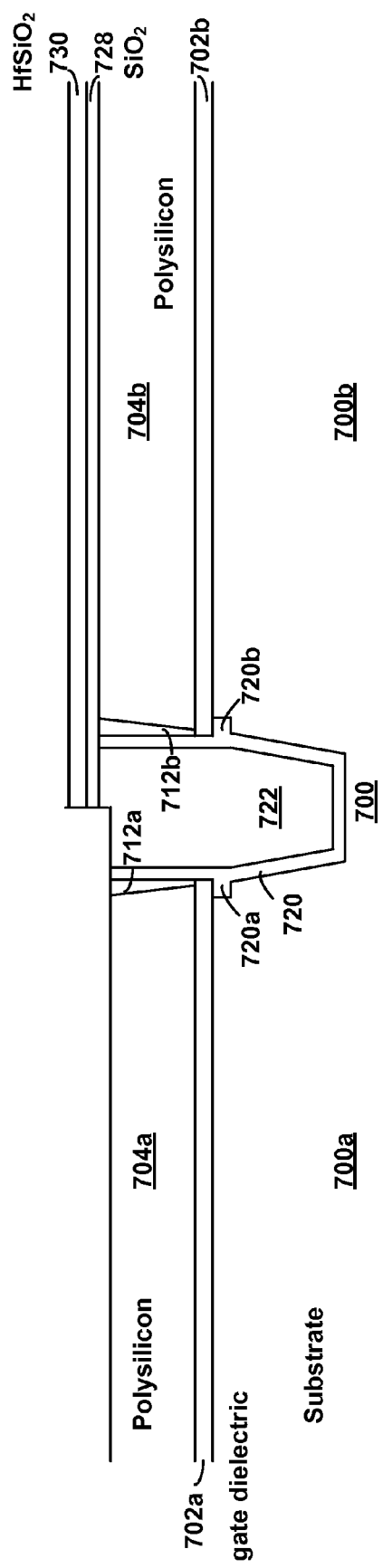
Figure 7M:
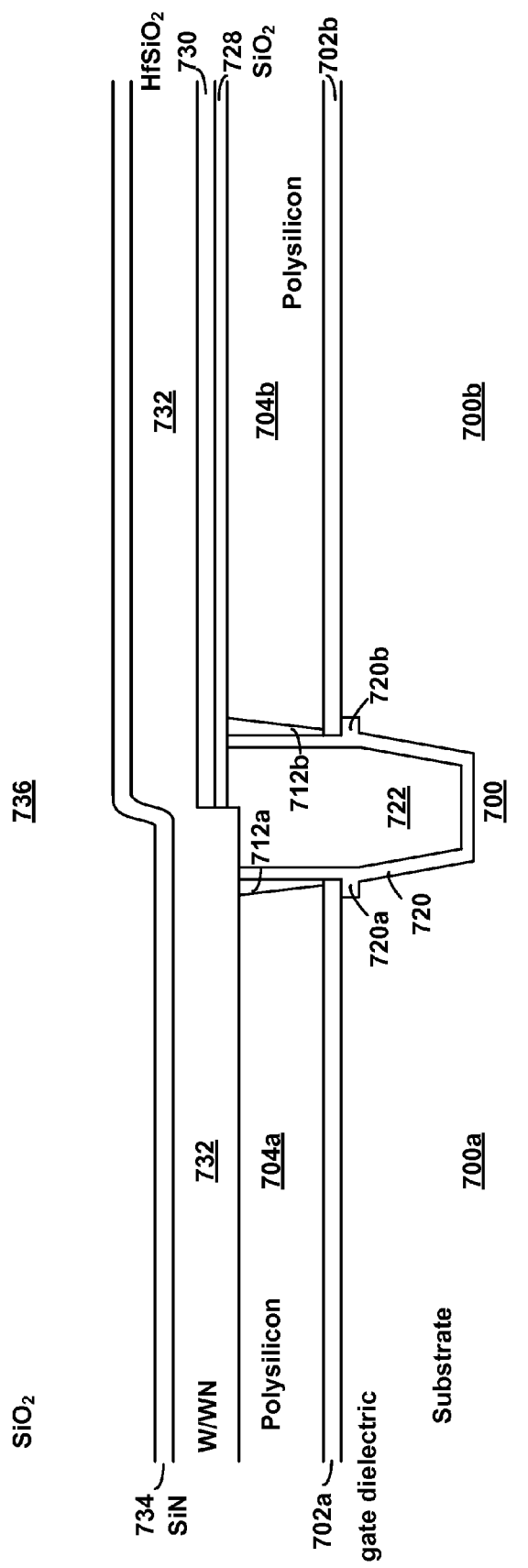
Figure 7N:
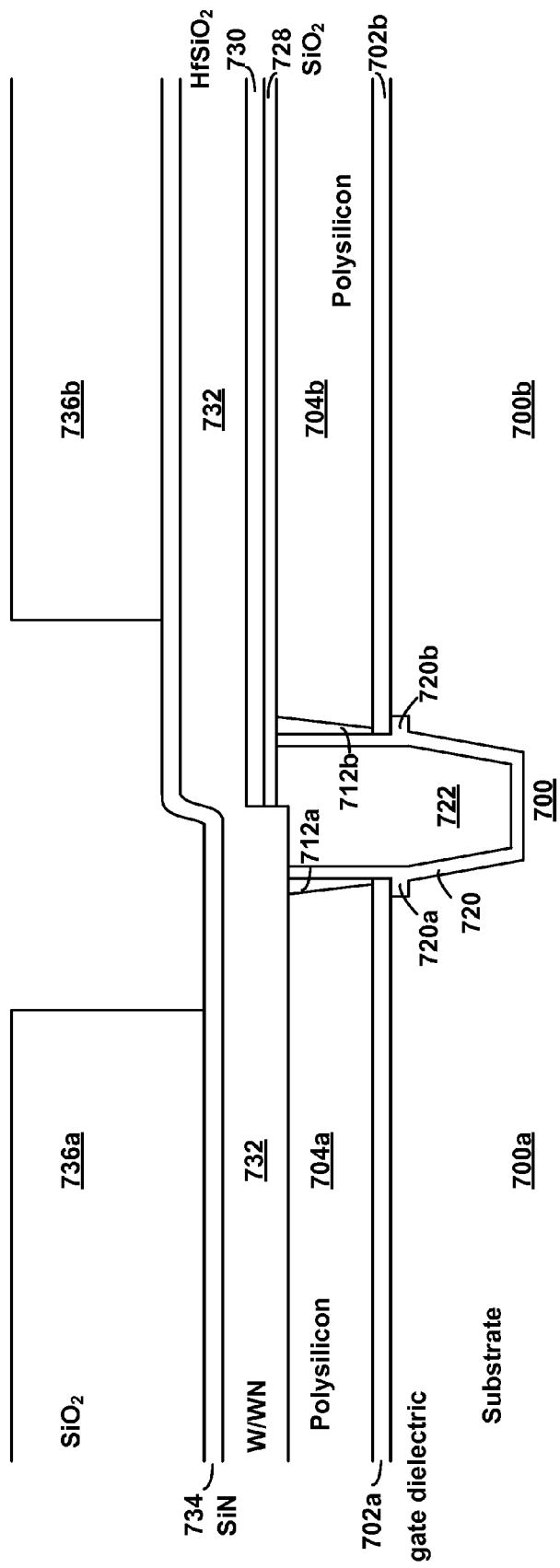
Figure 7O:
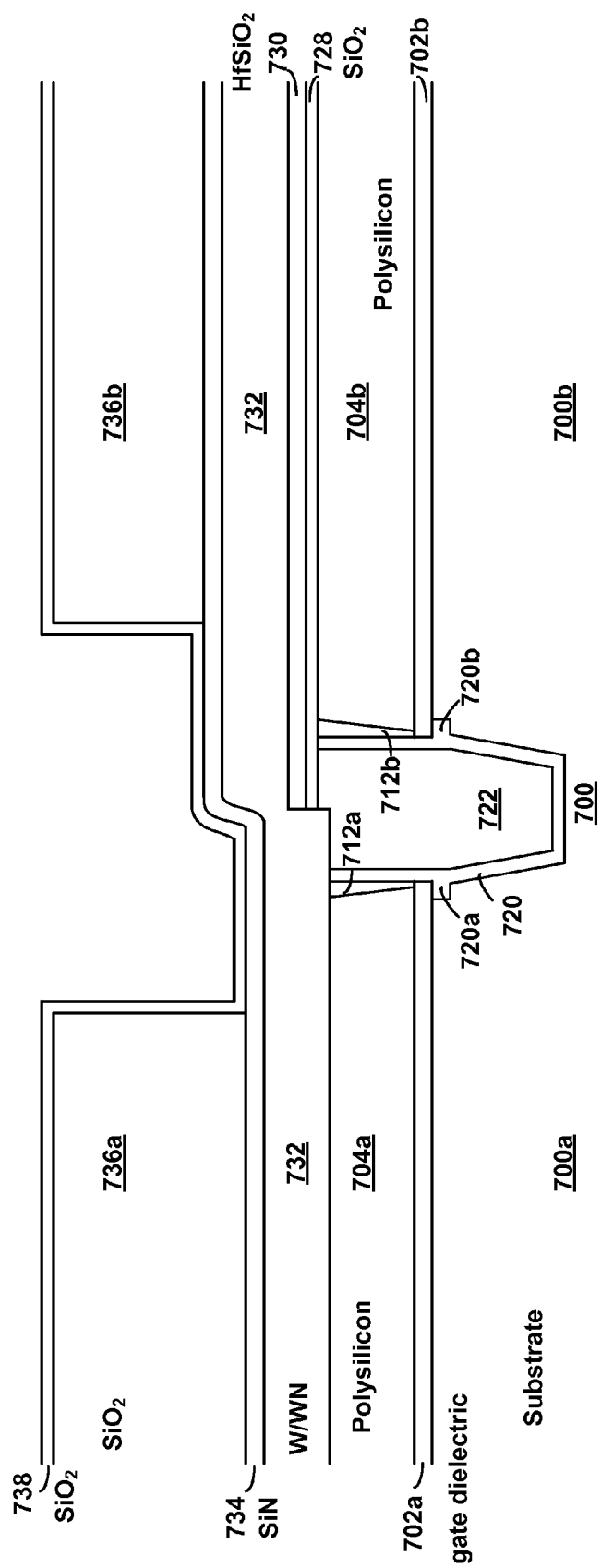
Figure 7P:
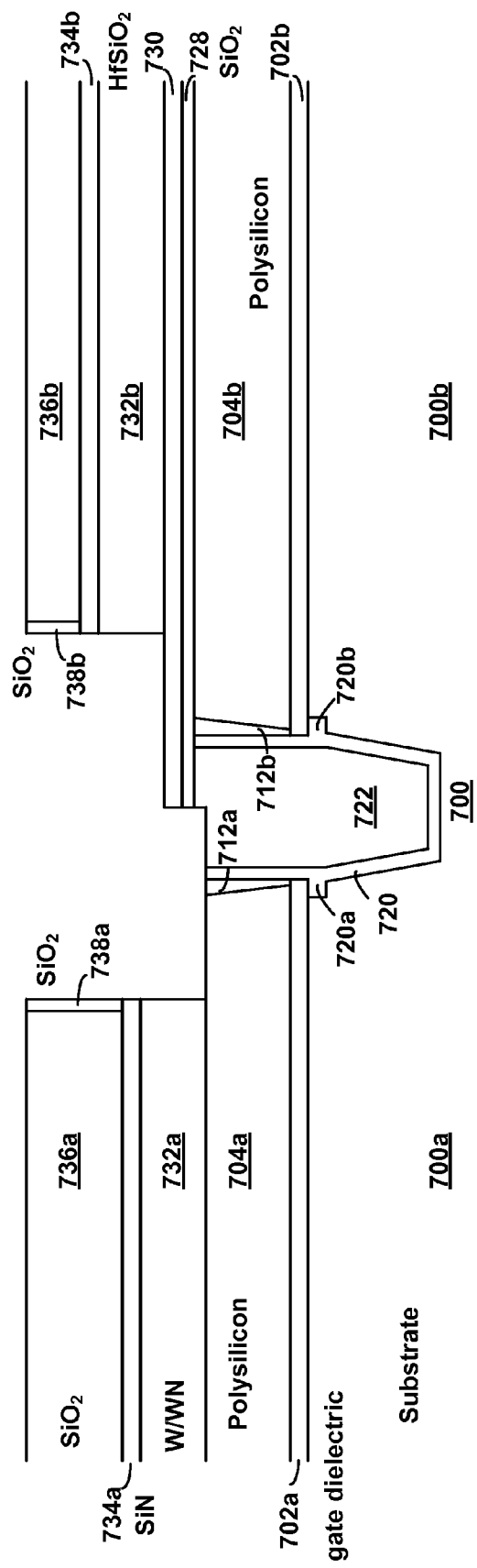
Figure 7Q:
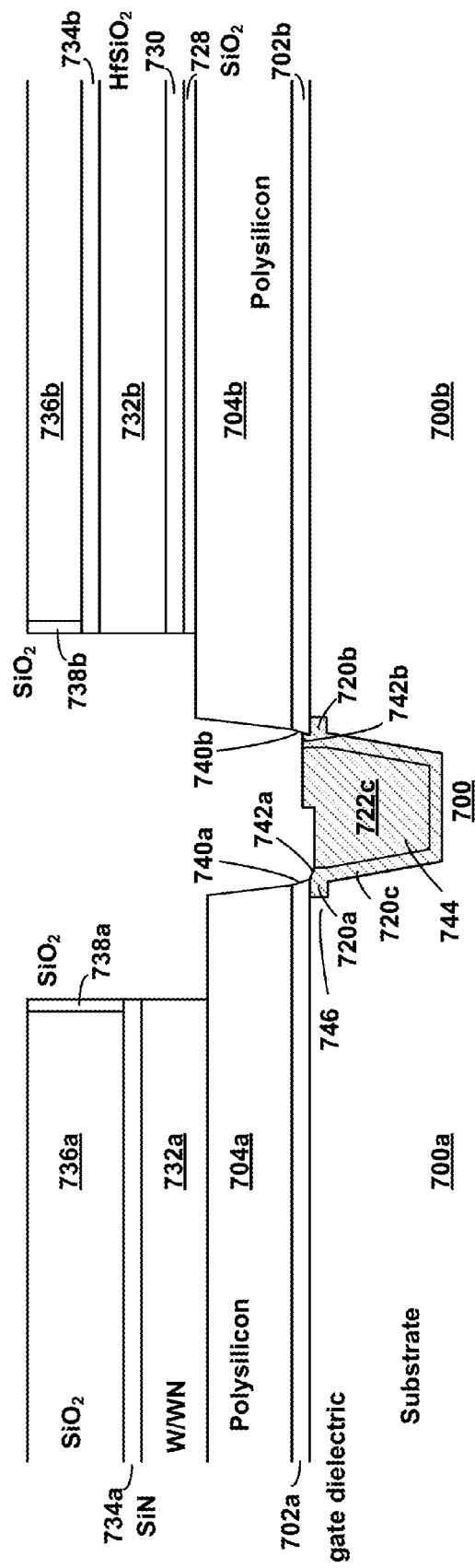
Figure 7R:
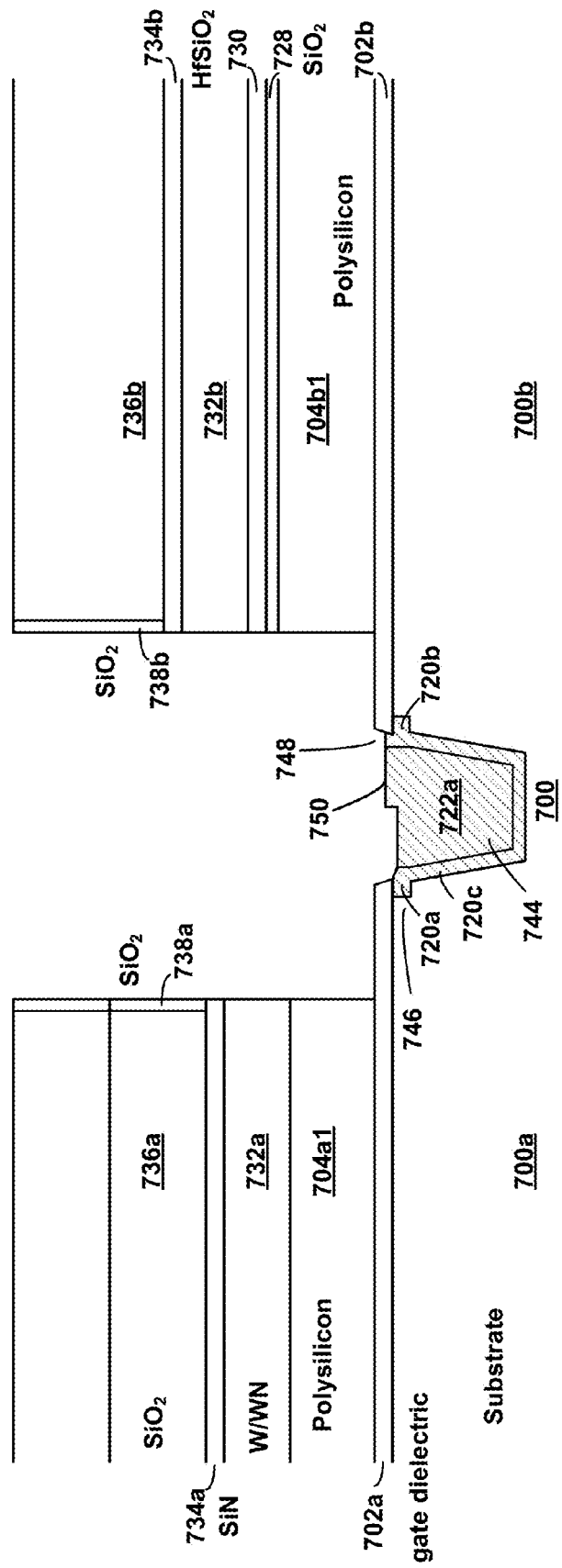

Referring now to FIGS. 7A-7R, an example method of forming a peripheral region of a flash memory device is described. With reference to FIG. 7A, substrate 700 is shown as having already undergone several processing steps. Substrate 700 may be any suitable substrate such as a silicon, germanium, silicon-germanium, undoped, doped, bulk, silicon-on-insulator ("SOI") or other substrate with or without additional circuitry. For example, substrate 700 may include one or more n-well or p-well regions (not shown).

Peripheral region gate oxide layer 702 is formed above substrate 700. In some embodiments, gate oxide layer 702 may be a layer of silicon dioxide, silicon nitride, silicon oxynitride or any other suitable insulating layer. Gate oxide layer 702 may be between about 30 angstroms and about 500 angstroms, although other thicknesses may be used.

Following formation of gate oxide layer 702, a semiconductor material layer 704 is deposited over gate oxide layer 702. In an embodiment, semiconductor material layer 704 is formed from a polycrystalline semiconductor material such as polysilicon, a polycrystalline silicon-germanium alloy, polygermanium or any other suitable material. Alternatively, semiconductor material layer 704 may be formed from a wide band-gap semiconductor material, such as ZnO, InGaZnO, or SiC, which may provide a high breakdown voltage, and typically may be used to provide junctionless FETs. Persons of ordinary skill in the art will understand that other materials may be used. For simplicity, semiconductor material layer 704 will be referred to herein as polysilicon layer 704.

In some embodiments, polysilicon layer 704 may be a heavily doped semiconductor material layer, such as n+ polysilicon. In some embodiments, n+ polysilicon layer 704 is in an amorphous state as deposited. In other embodiments, n+ polysilicon layer 704 is in a polycrystalline state as deposited. CVD or another suitable process may be employed to deposit n+ polysilicon layer 704.

In an example embodiment, n+ polysilicon layer 704 may be formed from about 100 to about 500 angstroms of phosphorus or arsenic doped silicon having a doping concentration of about $10^{21}$ cm$^{-3}$. Other layer thicknesses, doping types and/or doping concentrations may be used. n+ polysilicon layer 704 may be doped in situ, for example, by flowing a donor gas during deposition. Other doping methods may be used (e.g., implantation).

Alternatively, polysilicon layer 704 may be p+ polysilicon. p+ polysilicon layer 704 may either be deposited and doped by ion implantation or may be doped in situ during deposition. For example, an intrinsic silicon layer may be deposited on gate oxide layer 702, and a blanket p-type implant may be employed to implant boron a predetermined depth within the intrinsic silicon layer. Example implantable molecular ions include BF$_2$, BF$_3$, B and the like. In some embodiments, an implant dose of about 1-10×10$^{13}$ ions/cm$^2$ may be employed. Other implant species and/or doses may be used. Further, in some embodiments, a diffusion process may be employed. In at least one embodiment, the resultant p-type polysilicon layer 704 has a thickness of from about 100 to about 500 angstroms, although other p-type silicon layer thicknesses may be used.

A first dielectric material layer 706 is formed over polysilicon layer 704 to serve as a stop layer for CMP. For example, between about 100 angstroms to about 500 angstroms of silicon nitride may be deposited. Other CMP stop materials such as polysilicon and/or other material layer thicknesses may be used.

A second dielectric material layer 708 is formed over first dielectric material layer 706. For example, approximately 3000-7000 angstroms of silicon dioxide may be deposited over first dielectric material layer 706. Other materials such as polysilicon and silicon nitride, and/or other material layer thicknesses may be used.

Second dielectric material layer 708, first dielectric material layer 706 and polysilicon layer 704 are patterned and etched to form etched layer stacks 710a, disposed over a first portion of substrate 700 that will become a peripheral transistor region 700a, and 710b, disposed over a second portion of substrate 700 that will become a peripheral capacitor region 700b, resulting in the structure shown in FIG. 7B. Layer stack 710a includes second dielectric material region 708a, first dielectric material region 706a and polysilicon region 704a, and layer stack 710b includes second dielectric material region 708b, first dielectric material region 706b and polysilicon region 704b.

In an embodiment, second dielectric material layer 708, first dielectric material layer 706 and polysilicon layer 704 may be patterned and etched using conventional lithography techniques, with a soft or hard mask, and wet or dry etch processing. Second dielectric material layer 708, first dielectric material layer 706 and polysilicon layer 704 may be patterned and etched in a single pattern/etch procedure or using separate pattern/etch steps.

For example, photoresist may be deposited, patterned using standard photolithography techniques, layers 708, 706 and 704 may be etched, and then the photoresist may be removed. Alternatively, a hard mask of some other material, for example silicon dioxide, may be formed on top of second dielectric material layer 708, with bottom antireflective coating ("BARC") on top, then patterned and etched. Similarly, dielectric antireflective coating ("DARC") and/or amorphous carbon film (e.g., the Advanced Patterning Film from Applied Materials, Santa Clara, Calif.) may be used as a hard mask.

Any suitable masking and etching process may be used to form layer stacks 710a and 710b. For example, layers 708, 706 and 704 may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, layer stacks 710a and 710b may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 60 seconds and/or ultra-dilute hydrofluoric ("HF") acid (e.g., about 0.4-0.6 wt %) for 60 seconds. Megasonics may or may not be used. Other clean chemistries, times and/or techniques may be employed.

A third dielectric layer 712 is deposited conformally over layer stacks 710a and 710b. For example, between about 50 angstroms to about 500 angstroms of silicon dioxide may be deposited, resulting in the structure illustrated in FIG. 7C. Other dielectric materials such as silicon nitride, silicon oxynitride, low K dielectrics, etc., and/or other dielectric material layer thicknesses may be used.

An anisotropic etch is used to remove lateral portions of third dielectric layer 712 and gate oxide layer 702, leaving only sidewall portion 712a of third dielectric material on the sides of layers 708a, 706a, 704a, and leaving only sidewall portion 712b of third dielectric material on the sides of layers 708b, 706b, 704b, resulting in the structure shown in FIG. 7D. Sidewall portions 712a and 712b form sidewall liners, and are referred to herein as sidewall liners 712a and 712b. In addition, the etch removes the lateral portion of gate oxide layer 702 between layer stacks 710a and 710b, exposing region 714 of substrate 700. As a result, layer stacks 710a and 710b include gate oxide regions 702a and 702b, respectively.

Region 714 of substrate 700 is isotopically etched to etch a first trench tab recess 716a that extends under a first portion 718a of gate oxide region 702a, and a second trench tab recess 716b that extends under a second portion 718b of gate oxide region 702b, resulting in the structure shown in FIG. 7E. First trench tab recess 716a has a length Xa of between about 50 angstroms to about 500 angstroms, and second trench tab recess 716b has a length Xb of between about 50 angstroms to about 500 angstroms, although other lengths may be used. First trench tab recess 716a and second trench tab recess 716b each have a height Ya of between about 50 angstroms to about 500 angstroms, although other heights may be used. As will be described in more detail below, first trench tab recess 716a and second trench tab recess 716b are used to form first and second dielectric tab extensions of an STI dielectric trench.

A reactive ion etch (RIE) process is used to form a trench 716c that extends vertically downward from first trench tab recess 716a and second trench tab recess 716b, resulting in the structure shown in FIG. 7F. Trench 76 may have a height Yb of between about 1000 angstroms and about 3000 angstroms, although other heights may be used.

A fourth dielectric material layer 720 is deposited conformally over layer stacks 710a and 710b. For example, between about 50 angstroms to about 500 angstroms of silicon dioxide may be deposited, resulting in the structure illustrated in FIG. 7G. Other dielectric materials such as silicon nitride, silicon oxynitride, low K dielectrics, etc., and/or other dielectric material layer thicknesses may be used. Fourth dielectric material layer 720 will be used to form a dielectric liner for a dielectric trench. Thus, as used herein, fourth dielectric material layer 720 is also referred to as dielectric trench liner 720. As illustrated in FIG. 7G, dielectric trench liner 720 includes first dielectric trench tab extension 720a and second dielectric trench tab extension 720b formed in first trench tab recess 716a and second trench tab recess 716b, respectively. First dielectric trench tab extension 720a has a length Xa and a height Ya, and second dielectric trench tab extension 720b has a length Xb and a height Ya.

A fifth dielectric material layer 722 is deposited over substrate 700, filling trench 716c. For example, approximately between about 3000 angstroms to about 10000 angstroms of silicon dioxide may be deposited on substrate 700, resulting in the structure shown in FIG. 7H. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

Fifth dielectric material layer 722, dielectric trench liner 720, sidewall liners 712a and 712b, and second dielectric material regions 708a and 708b are planarized using chemical mechanical polishing or an etchback process to form a planar surface 724, resulting in the structure shown in FIG. 7I.

First dielectric material regions 706a and 706b, dielectric trench liner 720, and sidewall liners 712a and 712b are planarized using chemical mechanical polishing or an etchback process to form a planar surface 726, resulting in the structure shown in FIG. 7J.

The dielectric material for the peripheral region capacitors is deposited over substrate 700. The peripheral region capacitor dielectric may be a single layer of dielectric material, or may include multiple layers of dielectric material. In an example embodiment, a first capacitor dielectric material layer 728 is deposited over substrate 700, and a second capacitor dielectric material layer 730 is deposited on first capacitor dielectric material layer 728, resulting in the structure shown in FIG. 7K.

In an example embodiment, first capacitor dielectric material layer 728 may be between about 20 angstroms to about 200 angstroms of silicon dioxide, and second capacitor dielectric material layer 730 may be between about 20 angstroms to about 200 angstroms of hafnium silicon dioxide, although other dielectric materials and/or other dielectric material layer thicknesses may be used. In other embodiments, three, four or more capacitor dielectric materials may be stacked on one another.

As mentioned above, a portion of first capacitor dielectric material layer 728 and second capacitor dielectric material layer 730 may be removed from the portion over peripheral transistor region 700a to avoid impurities from first capacitor dielectric material layer 728 and/or second capacitor dielectric material layer 730. In an embodiment, first capacitor dielectric material layer 728 and second capacitor dielectric material layer 730 may be patterned and etched using conventional lithography techniques, with a soft or hard mask, and wet or dry etch processing, resulting in the structure shown in FIG. 7L. First capacitor dielectric material layer 728 and second capacitor dielectric material layer 730 may be patterned and etched in a single pattern/etch procedure or using separate pattern/etch steps.

For example, photoresist may be deposited, patterned using standard photolithography techniques, layers 728 and 730 may be etched, and then the photoresist may be removed. Alternatively, a hard mask of some other material, for example silicon dioxide, may be formed on top of second capacitor dielectric material layer 730, with BARC on top, then patterned and etched. Similarly, DARC and/or amorphous carbon film may be used as a hard mask.

Any suitable masking and etching process may be used. For example, layers 728 and 730 may be patterned with about 1 to about 1.5 micron, more preferably about 1.2 to about 1.4 micron, of PR using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, layer 728 and 730 may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 60 seconds and/or ultra-dilute HF acid (e.g., about 0.4-0.6 wt %) for 60 seconds. Megasonics may or may not be used. Other clean chemistries, times and/or techniques may be employed.

The material layers used to form gate contacts for transistors in peripheral transistor region 700a, and top electrodes for capacitors in peripheral capacitor region 700b are deposited over substrate 700. In an example embodiment, a conductive layer 732 is deposited over substrate 700. Conductive layer 732 may include any suitable conductive material such as tungsten/tungsten nitride or another appropriate metal, heavily doped semiconductor material, a conductive silicide, a conductive silicide-germanide, a conductive germanide, or the like deposited by any suitable method (e.g., CVD, PVD, etc.).

In at least one embodiment, conductive layer 732 may comprise between about 200 angstroms and about 1000 angstroms of tungsten/tungsten nitride. Other conductive layer materials and/or thicknesses may be used. In some embodiments, an adhesion layer, such as titanium nitride or other similar adhesion layer material, may be disposed between polysilicon region 704a and second capacitor dielectric material layer 730 and conductive layer 732. In addition, in some embodiments, an adhesion layer 734, such as silicon nitride or other similar adhesion layer material, may be disposed on conductive layer 732. Persons of ordinary skill in the art will understand that adhesion layers may be formed by PVD or another method.

In an example embodiment, adhesion layer 734 is between about 50 angstroms and about 300 angstroms of silicon nitride. Other adhesion layer materials and/or thicknesses may be employed.

Following formation of conductive layer 732 and adhesion layer 734, a sixth dielectric material layer 736 is deposited over adhesion layer 734. For example, approximately 3000 7000 angstroms of silicon dioxide may be deposited on substrate 700, resulting in the structure shown in FIG. 7M. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

Sixth dielectric material layer 736 is then patterned and etched to form sixth dielectric material regions 736a and 736b. In an embodiment, sixth dielectric material layer 736 may be patterned and etched using conventional lithography techniques, with a soft or hard mask, and wet or dry etch processing, resulting in the structure shown in FIG. 7N.

For example, photoresist may be deposited, patterned using standard photolithography techniques, sixth dielectric material layer 736 may be etched, and then the photoresist may be removed. Alternatively, a hard mask of some other material, for example silicon dioxide, may be formed on top of sixth dielectric material layer 736, with BARC on top, then patterned and etched. Similarly, DARC and/or amorphous carbon film may be used as a hard mask.

Any suitable masking and etching process may be used. For example, sixth dielectric material layer 736 may be patterned with about 1 to about 1.5 micron, more preferably about 1.2 to about 1.4 micron, of PR using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, sixth dielectric material layer 736 may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 60 seconds and/or ultra-dilute HF acid (e.g., about 0.4-0.6 wt %) for 60 seconds. Megasonics may or may not be used. Other clean chemistries, times and/or techniques may be employed.

A dielectric liner 738 is deposited conformally over layer stacks sixth dielectric material regions 736a and 736b, and adhesion layer 734. For example, between about 20 angstroms to about 500 angstroms of silicon dioxide may be deposited, resulting in the structure illustrated in FIG. 7O. Other dielectric materials such as silicon nitride, silicon oxynitride, low K dielectrics, etc., and/or other dielectric material layer thicknesses may be used. In some embodiments, dielectric liner 738 can be omitted.

An anisotropic etch is used to remove lateral portions of dielectric liner 738, leaving only sidewall portions 738a and 738b of dielectric liner material on the sides of sixth dielectric material regions 736a and 736b, respectively. In addition, the etch removes lateral portions of adhesion layer 734 and conductive layer 732, leaving conductive layer regions 732a and 732b, and adhesion layer regions 734a and 734b between sixth dielectric material regions 736a and 736b, respectively. The etch exposes a portion of polysilicon region 704a, top portions of third dielectric material sidewall portion 712a, dielectric trench liner 720, and portions of dielectric trench 722, first capacitor dielectric material layer 728 and second capacitor dielectric material layer 730, resulting in the structure shown in FIG. 7P.

Next, an anisotropic etch is used to remove lateral portions of second capacitor dielectric material layer 730, first capacitor dielectric material layer 728, dielectric trench liner 720, third dielectric material sidewall portions 712a and 712b and a portion of dielectric trench 722. The etch exposes edges 740a and 740b of gate oxide regions 702a and 702b, respectively, edges 742a and 742b of dielectric trench liner 720, and a top surface of dielectric trench 722, resulting in the structure shown in FIG. 7Q. The remaining (unetched) portion of dielectric trench liner 720 are labeled 720c, and the remaining (unetched) portion of dielectric trench 722 is labeled 722c. As illustrated in FIG. 7Q, the etch may cause the top surface of dielectric trench 722c to be lower in peripheral transistor region 700a than in peripheral capacitor region 700b.

In the structure of FIG. 7Q, first dielectric trench tab extension 720a and second dielectric trench tab extension 720b, dielectric trench liner 720c and dielectric trench 722c collectively form an STI trench 744, shown in cross-hatch. STI trench 744 includes first dielectric trench tab extension 720a and second dielectric trench tab extension 720b that are disposed at a top portion of STI trench 744. In an example embodiment, first dielectric trench tab extension 720a extends in a first direction from STI trench 744 (e.g., in a negative x-direction), and second dielectric trench tab extension 720b extends in a second direction (e.g., in a positive x-direction) from STI trench 744. In an example embodiment, first dielectric trench tab extension 720a and second dielectric trench tab extension 720b extend substantially horizontally outward from STI trench 744.

Without wanting to be bound by any particular theory, it is believed that first dielectric trench tab extension 720a and second dielectric trench tab extension 720b may prevent gouging of active area portion 746 of peripheral transistor region 700a.

Finally, polysilicon regions 704a and 704b are etched back to form transistor gate 704a1 and a capacitor bottom plate 704b1, respectively, resulting in the structure shown in FIG. 7R. Without wanting to be bound by any particular theory, it is believed that first dielectric trench tab extension 720a and second dielectric trench tab extension 720b may prevent polysilicon residue forming in region 748 as a result of under-etching of capacitor bottom plate 704b1.

In particular, it is believed that the presence of first dielectric trench tab extension 720a may allow more time for etching layers 722, 728 and 730 without exposing active area portion 746 of peripheral transistor region 700a, and may prevent gouging of the substrate (such as gouging of an active area portion 428 of transistor region 404 shown in FIG. 6B) during the etch of polysilicon regions 704*a* and 704*b*. As a result of this additional etch time, it is believed that a top portion 750 of STI trench 744 will not exceed a height of gate oxide region 702*b*, and thus prevent polysilicon residue portions forming (such as polysilicon residue portion 430 shown in FIG. 6B).

Figure 8:
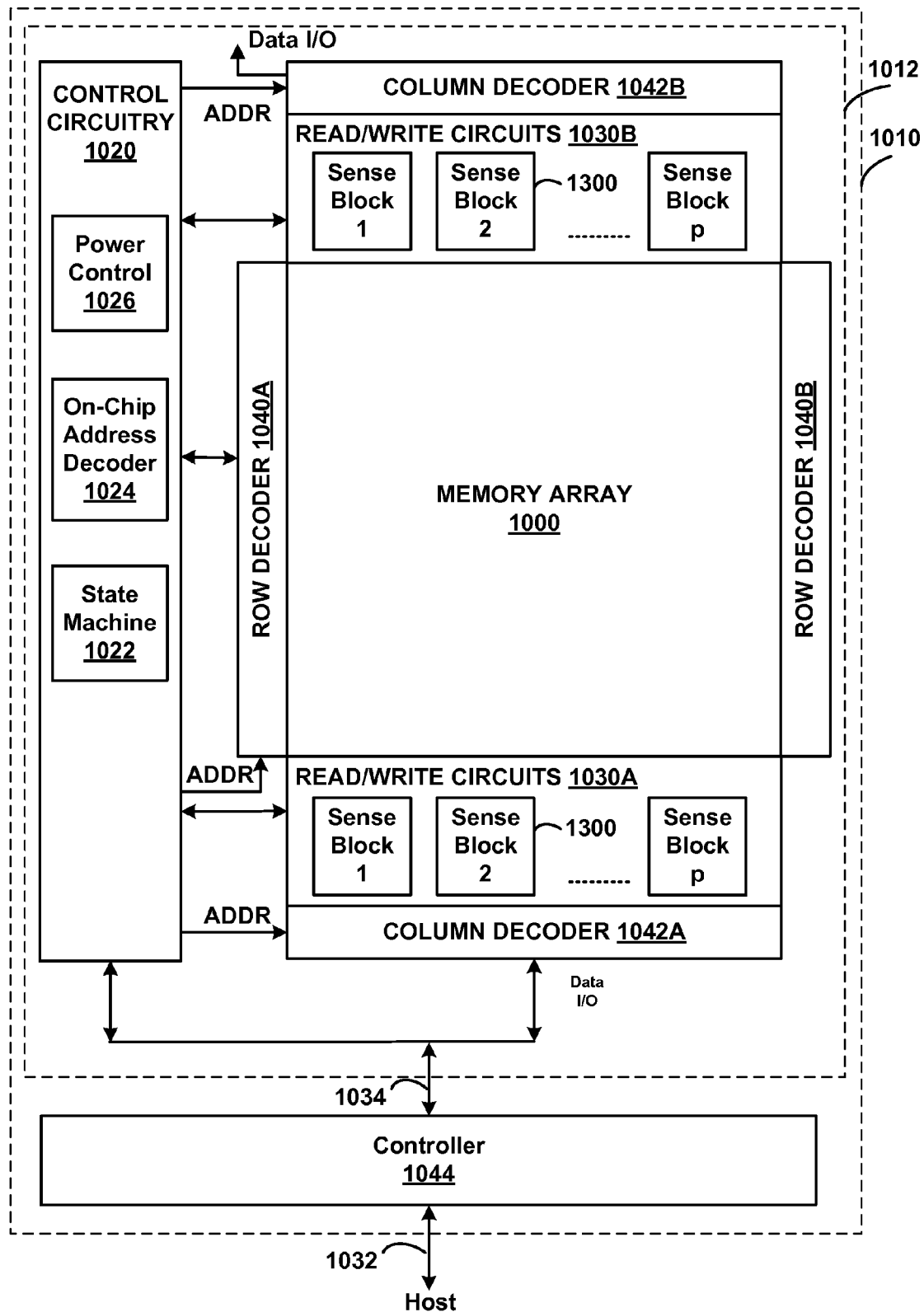
FIG. 8 is a block diagram depicting an example of a memory system.

FIG. 8 illustrates a non-volatile storage device 1010 that may include one or more memory die or chips 1012. Memory die 1012 includes an array (two-dimensional or three dimensional) of memory cells 1000, control circuitry 1020, and read/write circuits 1030A and 1030B. In one embodiment, access to the memory array 1000 by the various peripheral circuits is implemented in a symmetric fashion, on opposite sides of the array, so that the densities of access lines and circuitry on each side are reduced by half. The read/write circuits 1030A and 1030B include multiple sense blocks 1300 which allow a page of memory cells to be read or programmed in parallel. The memory array 1000 is addressable by word lines via row decoders 1040A and 1040B and by bit lines via column decoders 1042A and 1042B. In a typical embodiment, a controller 1044 is included in the same memory device 1010 (e.g., a removable storage card or package) as the one or more memory die 1012. Commands and data are transferred between the host and controller 1044 via lines 1032 and between the controller and the one or more memory die 1012 via lines 1034. One implementation can include multiple chips 1012.

Control circuitry 1020 cooperates with the read/write circuits 1030A and 1030B to perform memory operations on the memory array 1000. The control circuitry 1020 includes a state machine 1022, an on-chip address decoder 1024 and a power control module 1026. The state machine 1022 provides chip-level control of memory operations. The on-chip address decoder 1024 provides an address interface to convert between the address that is used by the host or a memory controller to the hardware address used by the decoders 1040A, 1040B, 1042A, and 1042B. The power control module 1026 controls the power and voltages supplied to the word lines and bit lines during memory operations. In one embodiment, power control module 1026 includes one or more charge pumps that can create voltages larger than the supply voltage.

In one embodiment, one or any combination of control circuitry 1020, power control circuit 1026, decoder circuit 1024, state machine circuit 1022, decoder circuit 1042A, decoder circuit 1042B, decoder circuit 1040A, decoder circuit 1040B, read/write circuits 1030A, read/write circuits 1030B, and/or controller 1044 can be referred to as one or more managing circuits.

In one embodiment, an array of memory cells 1000 is divided into a large number of blocks (e.g., blocks 0-1023, or another amount) of memory cells. As is common for flash EEPROM systems, the block is the unit of erase. That is, each block contains the minimum number of memory cells that are erased together. Other units of erase can also be used. A block contains a set of NAND strings which are accessed via bit lines and word lines. Typically, all of the NAND strings in a block share a common set of word lines.

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. Thus, in one embodiment, the set of memory cells that are connected to a common word line are programmed simultaneously. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Various features and techniques have been presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

One embodiment includes a NAND memory that includes a memory cell region and a peripheral region. The peripheral region includes a shallow trench isolation trench disposed in a substrate. The shallow trench isolation trench has a first tab extension and a second tab extension. The first tab extension is disposed at a top portion of the shallow trench isolation trench, and extends in a first direction from the shallow trench isolation trench. The second tab extension is disposed at a top portion of the shallow trench isolation trench, and extends in a second direction from the shallow trench isolation trench.

One embodiment includes a method of forming a NAND memory. The method includes forming a memory cell region in a substrate, forming a peripheral region in the substrate adjacent the memory cell region, and forming a shallow trench isolation trench in the substrate in the peripheral region. Forming the shallow trench isolation trench includes forming a first tab extension at a top portion of the shallow trench isolation trench, and forming a second tab extension at a top portion of the shallow trench isolation trench. The first tab extension extends in a first direction from the shallow trench isolation trench, the second tab extension extends in a second direction from the shallow trench isolation trench.

One embodiment includes a method of forming a shallow trench isolation trench in a substrate of a peripheral region of a NAND memory. The method includes forming a first dielectric material layer on the substrate, etching the dielectric material layer to expose a region of the substrate, forming a first trench tab recess that extends under a first portion of the first dielectric material layer, forming a second trench tab recess that extends under a second portion of the first dielectric material layer, forming a trench that extends vertically downward from the first trench tab recess and the second trench tab recess, and forming a second dielectric material in the first trench tab recess, the second trench tab recess and the trench.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

The invention claimed is:

1. A method of forming a NAND memory, the method comprising:
   forming a memory cell region in a substrate;
   forming a peripheral region in the substrate adjacent the memory cell region;
   forming a shallow trench isolation trench in the substrate in the peripheral region by:
      forming a dielectric material over the substrate;
      removing a portion of the dielectric material to form an exposed portion of the substrate;
      etching the exposed portion of the substrate to form a first tab extension and a second tab extension at a top portion of the shallow trench isolation trench, the first tab extension extending in a first direction from the shallow trench isolation trench, the second tab extension extending in a second direction from the shallow trench isolation trench; and
      etching the substrate downward from the first tab extension and the second tab extension to form a trench,
   wherein a bottom surface of a first portion of the dielectric material comprises a top surface of the first tab extension, and a bottom surface of a second portion of the dielectric material comprises a top surface of the second tab extension.

2. The method of claim 1, wherein:
   forming the first tab extension comprises forming the first tab extension to extend substantially horizontally outward from the shallow trench isolation trench; and
   forming the second tab extension comprises forming the second tab extension to extend substantially horizontally outward from the shallow trench isolation trench.

3. The method of claim 1, wherein the first tab extension and the second tab extension each have a length of between about 50 angstroms and about 500 angstroms.

4. The method of claim 1, wherein the first tab extension and the second tab extension each have a height of between about 50 angstroms and about 500 angstroms.

5. The method of claim 1, wherein the shallow trench isolation trench comprises a dielectric material.

6. The method of claim 1, wherein the shallow trench isolation trench comprises one or more of silicon dioxide, silicon nitride, silicon oxynitride, and low K dielectrics.

7. The method of claim 1, wherein the peripheral region comprises a transistor region and a capacitor region, and the method comprises forming the shallow trench isolation trench between the transistor region and the capacitor region.

8. A method of forming a shallow trench isolation trench in a substrate of a peripheral region of a NAND memory, the method comprising:
   forming a first dielectric material layer on the substrate;
   etching the first dielectric material layer to expose a region of the substrate;
   etching the exposed region of the substrate to form a first trench tab recess that extends under an exposed underside of a first portion of the first dielectric material layer and a second trench tab recess that extends under an exposed underside of a second portion of the first dielectric material layer;
   etching vertically downward from the first trench tab recess and the second trench tab recess to form a trench; and
   forming a second dielectric material in the first trench tab recess, the second trench tab recess and the trench.

9. The method of claim 8, wherein the first trench tab recess and the second trench tab recess each have a length of between about 50 angstroms and about 500 angstroms.

10. The method of claim 8, wherein the first trench tab recess and the second trench tab recess each have a height of between about 50 angstroms and about 500 angstroms.

11. The method of claim 8, wherein the trench has a height of between about 1000 angstroms and about 3000 angstroms.

12. The method of claim 8, wherein the second dielectric material layer comprises one or more of silicon dioxide, silicon nitride, silicon oxynitride, and low K dielectrics.

13. The method of claim 8, wherein the peripheral region of the NAND memory comprises a transistor region and a capacitor region, and the method comprises forming the shallow trench isolation trench between the transistor region and the capacitor region.

* * * * *